United States Patent
Filipovic et al.

(10) Patent No.: US 8,014,476 B2
(45) Date of Patent: Sep. 6, 2011

(54) WIRELESS DEVICE WITH A NON-COMPENSATED CRYSTAL OSCILLATOR

(75) Inventors: Daniel F. Filipovic, Solana Beach, CA (US); Charles J. Persico, Rancho Santa Fe, CA (US); Christopher C. Riddle, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 943 days.

(21) Appl. No.: 11/269,360

(22) Filed: Nov. 7, 2005

(65) Prior Publication Data

US 2007/0104298 A1 May 10, 2007

(51) Int. Cl.
*H04L 27/06* (2006.01)
(52) U.S. Cl. ........................................ 375/344; 375/355
(58) Field of Classification Search .................. 375/344, 375/355
See application file for complete search history.

(56) References Cited

U.S. PATENT DOCUMENTS

| | | | |
|---|---|---|---|
| 5,245,611 A | 9/1993 | Ling et al. | |
| 5,579,346 A | 11/1996 | Kanzaki | |
| 6,034,564 A | 3/2000 | Iwamatsu et al. | |
| 6,396,884 B1 | 5/2002 | Maruyama | |
| 6,545,950 B1 | 4/2003 | Walukas et al. | |
| 7,110,732 B2 * | 9/2006 | Mostafa et al. | 455/130 |
| 2002/0127984 A1 * | 9/2002 | Barak | 455/183.2 |
| 2005/0078743 A1 | 4/2005 | Shohara | |

FOREIGN PATENT DOCUMENTS

| | | |
|---|---|---|
| EP | 0649237 A1 | 4/1995 |
| TW | 589792 | 6/2004 |
| TW | 589796 | 6/2004 |
| TW | 589798 | 6/2004 |
| WO | WO 02060144 A2 | 8/2002 |

OTHER PUBLICATIONS

International Search Report and Written Opinion—PCT/US2006/060626, International Search Authority—European Patent Office—Mar. 7, 2007.

* cited by examiner

*Primary Examiner* — Kevin Y Kim
(74) *Attorney, Agent, or Firm* — Kenyon S. Jenckes; William M. Hooks

(57) ABSTRACT

A wireless device achieves good performance using a crystal oscillator that is not compensated for temperature. The crystal oscillator provides a reference signal having a temperature dependent frequency error. A control unit estimates the frequency error (e.g., based on a received pilot) and provides a frequency error estimate. A clock generator generates a digital clock, which tracks chip timing, based on the reference signal and the frequency error estimate. A receiver frequency downconverts an input RF signal with a receive LO signal having the frequency error and provides an analog baseband signal. An ADC digitizes the analog baseband signal based on a sampling clock having the frequency error and provides ADC samples. A re-clocking circuit re-clocks the ADC samples based on a digital clock and provides data samples. A digital rotator frequency translates the data samples based on the frequency error estimate and provides frequency-translated samples centered near DC.

38 Claims, 8 Drawing Sheets

WIRELESS DEVICE WITH A NON-COMPENSATED CRYSTAL OSCILLATOR

BACKGROUND

I. Field

The present disclosure relates generally to electronics, and more specifically to a wireless device for wireless communication.

II. Background

In a wireless communication system, a wireless device (e.g., a cellular phone) may transmit data to and receive data from a base station for bi-directional communication. For data transmission, the wireless device modulates outgoing data onto a radio frequency (RF) carrier signal and generates an RF modulated signal that is more suitable for transmission via a wireless channel. The wireless device then transmits the RF modulated signal via a reverse link (or uplink) to the base station. For data reception, the wireless device receives an RF modulated signal transmitted via a forward link (or downlink) by the base station. The wireless device then conditions and digitizes the received signal to obtain samples and further processes the samples to recover the incoming data sent by the base station.

The wireless device typically utilizes various local oscillator (LO) signals for frequency upconversion and downconversion and various clock signals for digital signal processing. The LO signals and clock signals may need to be at precise frequencies in order to achieve good performance. To obtain the required frequency precision, a temperature compensated crystal oscillator (TCXO) or a voltage controlled TCXO (VCTCXO) is often used to generate a reference signal having a frequency that is precise over a specified temperature range. This reference signal is then used to generate the LO signals and clock signals, which would then have the frequency precision of the reference signal. However, the use of a TCXO or VCTCXO increases design complexity as well as cost for the wireless device.

There is therefore a need in the art for a wireless device that can achieve good performance without a TCXO or VCTCXO.

SUMMARY

A wireless device that can achieve good performance using a crystal oscillator that is not compensated for temperature is described herein. In an embodiment, the wireless device includes a control unit and a rotator. The control unit estimates the frequency error of the crystal oscillator and provides a frequency error estimate. Since the crystal oscillator is not compensated for temperature, the frequency error is temperature dependent. The rotator receives data samples having the frequency error, frequency translates the data samples based on the frequency error estimate, and provides frequency-translated samples In another embodiment, the wireless device includes an oscillator, a control unit, at least one analog-to-digital converter (ADC), and a rotator. The oscillator provides a reference signal having a frequency error that is temperature dependent. The control unit estimates the frequency error of the reference signal and provides a frequency error estimate. The ADC(s) digitize an analog signal based on a sampling clock having the frequency error and provide ADC samples. The rotator frequency translates data samples, which may be the ADC samples or generated from the ADC samples, based on the frequency error estimate and provides frequency-translated samples.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

The wireless device described herein may be any electronics device used for communication, computing, networking, and other applications. For example, the wireless device may be a cellular phone, a personal digital assistant (PDA), a wireless modem card, an access point, or some other device used for wireless communication. The wireless device may also be called a mobile station, a user equipment, a terminal, a subscriber unit, a station, or some other terminology.

The wireless device described herein may be used for various wireless communication systems such as a code division multiple access (CDMA) system, a time division multiple access (TDMA) system, a frequency division multiple access (FDMA) system, an orthogonal frequency division multiple access (OFDMA) system, an orthogonal frequency division multiplexing (OFDM) system, a single-carrier frequency division multiple access (SC-FDMA) system, and other systems that transmit modulated data. A CDMA system may implement one or more radio access technologies such as cdma2000, Wideband-CDMA (W-CDMA), and so on. cdma2000 covers IS-95, IS-2000, and IS-856 standards. A TDMA system may implement Global System for Mobile Communications (GSM). GSM and W-CDMA are described in documents from a consortium named "3rd Generation Partnership Project" (3GPP). cdma2000 is described in documents from a consortium named "3rd Generation Partnership Project 2" (3GPP2). 3GPP and 3GPP2 documents are publicly available. An OFDMA system utilizes OFDM. An OFDM-based system transmits modulation symbols in the frequency domain whereas an SC-FDMA system transmits modulation symbols in the time domain. For clarity, much of the description below is for a wireless device (e.g., cellular phone) in a CDMA system, which may implement cdma2000 or W-CDMA. The wireless device may also be able to receive and process GPS signals from GPS satellites.

Figure 1:
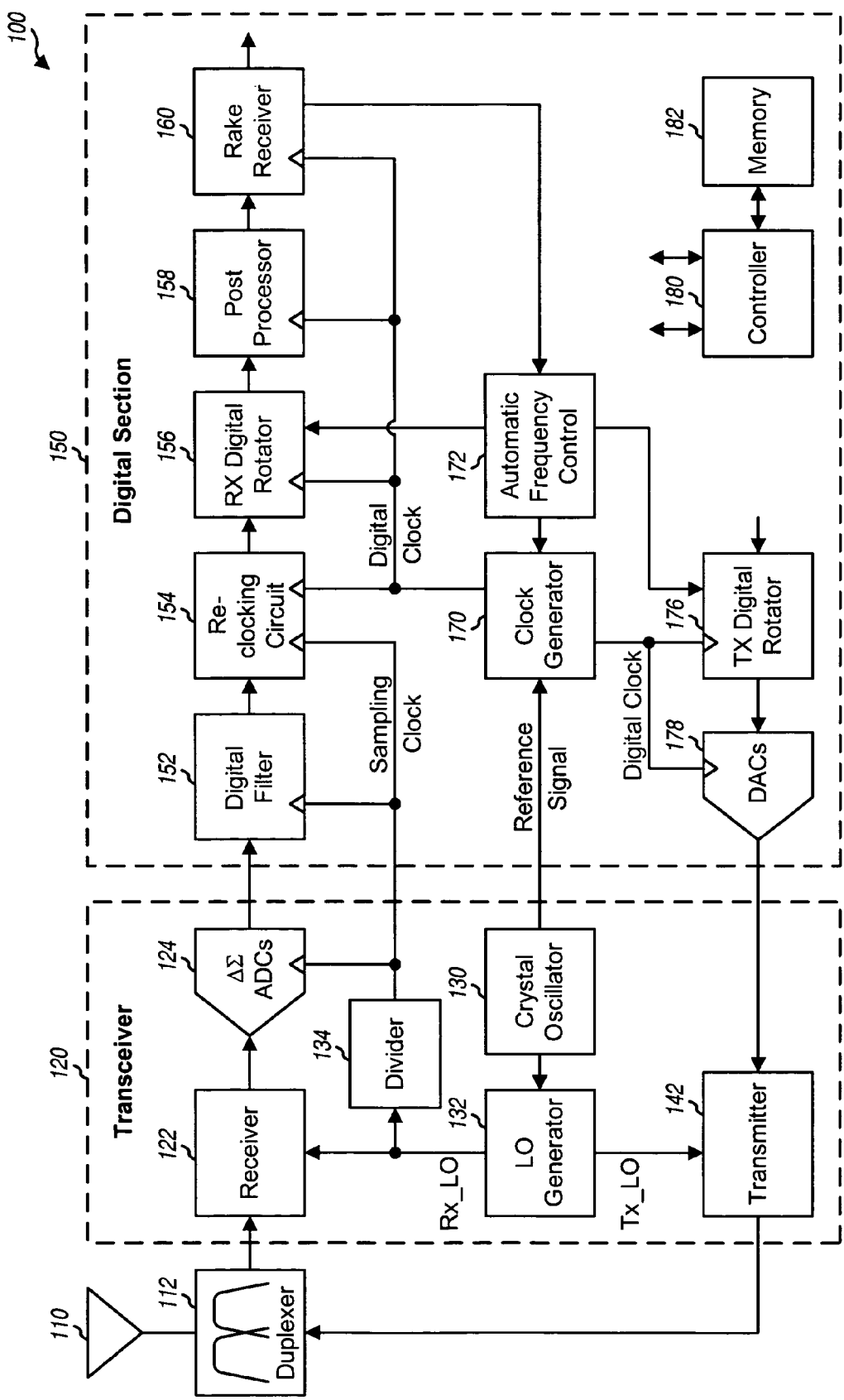
FIG. 1 shows a block diagram of a wireless device.

FIG. 1 shows a block diagram of an embodiment of a wireless device 100 for a CDMA system. On the receive path, an antenna 110 receives one or more RF modulated signals from one or more base stations and provides a received RF signal to a duplexer 112. Duplexer 112 filters the received RF signal for a desired forward link frequency band and provides an input RF signal to a receiver 122 within a transceiver 120. The desired frequency band may be cellular band from 824 to 894 MHz, PCS band from 1850 to 1990 MHz, DCS band from 1710 to 1880 MHz, IMT-2000 band from 1920 to 2170 MHz, or some other frequency band.

Receiver 122 amplifies and filters the input RF signal. Receiver 122 may also implement a direct-to-baseband architecture or a super-heterodyne architecture. In the super-heterodyne architecture, the input RF signal is frequency downconverted in multiple stages, e.g., from RF to an intermediate frequency (IF) in one stage, and then from IF to baseband in another stage. In the direct-to-baseband architecture, the input RF signal is frequency downconverted from RF directly to baseband in one stage. The following description assumes that receiver 122 implements the direct-to-baseband architecture. In this case, receiver 122 frequency downconverts the input RF signal to baseband with a receive local oscillator (Rx_LO) signal. The frequency of the Rx_LO signal is selected such that the signal in a desired CDMA channel is frequency downconverted to baseband. Receiver 122 provides an analog baseband signal containing the desired signal centered at or near DC.

Analog-to-digital converters (ADCs) 124 digitize the analog baseband signal based on a sampling clock and provide ADC samples to a digital filter 152 within a digital section 150. ADCs 124 may be delta-sigma ADCs (ΔΣ ADCs) as shown in FIG. 1, flash ADCs, or some other types of ADCs. A ΔΣ ADC can digitize an input signal with few bits of resolution but at a sampling rate that is many times higher than the bandwidth of the signal. As a specific example, ΔΣ ADCs 124 may digitize the analog baseband signal with four bits of resolution at approximately 32 times chip rate (or chip×32). The chip rate is 1.2288 megachips/second (Mcps) for cdma2000 and 3.84 Mcps for W-CDMA. These ADC samples may be subsequently processed to obtain output samples with 18 bits of resolution at the chip rate (or chip×1).

Digital filter 152 filters the ADC samples based on the sampling clock and provides filtered samples. Digital filter 152 may be a finite impulse response (FIR) filter, an infinite impulse response (IIR) filter, or some other type of filter. Digital filter 152 may also perform DC offset removal and/or other functions. A re-clocking circuit 154 receives and re-clocks or re-samples the filtered samples based on a digital clock and provides data samples.

A receive (RX) digital rotator 156 frequency translates the data samples to correct for frequency error in the downconversion process and provides frequency-translated samples. A post-processor 158 may perform automatic gain control (AGC), digital filtering, sample rate conversion, and/or other processing on the frequency-translated samples and provides output samples. A rake receiver 160 performs demodulation on the output samples for one or more signal paths (or multipaths) and provides symbol estimates. A decoder (not shown in FIG. 1) may deinterleave and decode the symbol estimates and provide decoded data.

On the transmit path, one or more processing units (not shown in FIG. 1) process data to be transmitted and provide data chips. A transmit (TX) digital rotator 176 frequency translates the data chips to compensate for frequency error in the upconversion process and provides output chips. Digital-to-analog converters (DACs) 178 convert the output chips to analog and provide an analog output signal to a transmitter 142 within transceiver 120. Transmitter 142 amplifies and filters the analog output signal. Transmitter 142 also frequency upconverts the analog output signal to RF with a transmit LO (Tx_LO) signal and provides an output RF signal. The frequency of the Tx_LO signal is selected such that the analog output signal is frequency upconverted to a desired CDMA channel. Duplexer 112 filters the output RF signal for a reverse link frequency band and provides a filtered output RF signal for transmission via antenna 110.

Although not shown in FIG. 1 for simplicity, many signals within transceiver 120 and digital section 150 are complex signals having inphase (I) and quadrature (Q) components. Each processing unit may process the I and Q components either separately or jointly depending on the type of processing being performed.

A crystal oscillator (XO) 130 generates a reference signal having a predetermined frequency of $f_{ref}$ and good phase noise characteristics. As a specific example, crystal oscillator 130 may generate a 19.2 MHz reference signal. Crystal oscillator 130 is not compensated for temperature. Hence, the reference frequency $f_{ref}$ drifts with temperature and has a temperature dependent frequency error. An LO generator 132 receives the reference signal and generates the Rx_LO and Tx_LO signals for receiver 122 and transmitter 142, respectively. LO generator 132 may include (1) a set of voltage controlled oscillator (VCO) and phase locked loop (PLL) that generates the Rx_LO signal for the receive path and (2) another set of VCO and PLL that generates the Tx_LO signal for the transmit path. The VCO for each path generates a VCO signal having a frequency that may be varied by a control voltage. The PLL for each path generates the control voltage such that the VCO for that path is locked to the reference frequency. The Rx_LO or Tx_LO signal is then generated based on the VCO signal. Alternatively, LO generator 132 may include a single set of VCO and PLL and mixing circuits that generate the Rx_LO and Tx_LO signals. In any case, the frequency of the Rx_LO signal is determined by the CDMA channel being received, and the frequency of the Tx_LO signal is determined by the CDMA channel to transmit on.

A divider 134 receives the Rx_LO signal and generates the sampling clock. As a specific example, the Rx_LO signal may be at twice the cellular band, and divider 134 may divide the Rx_LO signal by a fixed integer divider ratio of either 44 or 45 to generate the sampling clock at approximately 40 MHz. Since the frequency of the Rx_LO signal varies depending on the CDMA channel being received, the sampling clock frequency also varies with the received CDMA channel. However, the sampling clock has good phase noise characteristics because of the fixed integer divider ratio.

A clock generator 170 receives the reference signal and generates the digital clock. In an embodiment, clock generator 170 includes a VCO/PLL and a multi-modulus divider. The VCO/PLL generates an oscillator signal having a frequency that is some fixed integer multiple of the reference frequency. The multi-modulus divider generates the digital clock based on the oscillator signal. As a specific example, the VCO/PLL may generate a 384 MHz oscillator signal that is 20 times higher in frequency than the 19.2 MHz reference signal from crystal oscillator 130. The multi-modulus divider may generate a chip×32 clock based on the 384 MHz signal. The chip×32 clock is 39.3216 MHz for cdma2000 and may be generated by dividing the 384 MHz signal by a non-integer divider ratio of 9.765625. The multi-modulus divider may also generate other clocks (e.g., a chip×16 clock) for other processing units within digital section 150. In another embodiment, clock generator 170 includes (1) a VCO running at an integer multiple of the chip×32 clock and (2) a PLL having a multi-modulus divider that divides the oscillator signal by a non-integer divider ratio to obtain a feedback signal at the reference frequency. In any case, the digital clock has a relatively accurate frequency that may be adjusted by changing the non-integer divider ratio. However, the digital clock has undesired spectral components (or spurs) generated by the non-integer divider ratio.

An automatic frequency control (AFC) unit 172 receives samples from rake receiver 160, estimates the frequency error based on these samples, and provides a frequency error estimate to digital rotators 156 and 176 and clock generator 170. Clock generator 170 adjusts its operation based on the frequency error estimate such that the digital clock tracks chip timing.

A controller 180 controls the operation of various units within wireless device 100. A memory 182 stores data and program codes for wireless device 100.

FIG. 1 shows a specific embodiment of wireless device 100. In general, the processing for data transmission and reception may be performed in various manners with various processing units. Transceiver 120 and digital section 150 may include different and/or additional processing blocks not shown in FIG. 1. Furthermore, the processing blocks may be arranged in other manners. For example, digital filter 152 may be positioned after re-clocking circuit 154 or after digital rotator 156.

Although not shown in FIG. 1 for simplicity, wireless device 100 may include another receive path to process GPS signals. The GPS receive path may include all or many of the processing blocks in the CDMA receive path. However, the processing blocks for the GPS receive path may be designed specifically for GPS and may operate at frequencies that are specific for GPS. For example, the receive LO signal would be at a GPS frequency, the ADC may sample at a different rate, the digital filter may have a different bandwidth, and so on.

Wireless device 100 can provide good performance using a crystal oscillator that is not compensated for temperature, or simply, a non-compensated crystal oscillator. Wireless device 100 has the following features:

Use of a "clean" sampling clock to digitize the baseband signal by the ADCs;
Use of a digital clock with sufficient chip timing accuracy for digital processing;
Use of a re-clocking circuit to go between the sampling clock and the digital clock;
Use of a digital rotator on the receive path to correct for frequency error in the frequency downconversion process;
Use of a digital rotator on the transmit path to compensate for frequency error in the frequency upconversion process;
Estimation of the frequency error of the crystal oscillator, which is temperature dependent since the crystal oscillator is uncompensated for temperature; and
Adjustment of the digital clock and the digital rotators in the receive and transmit paths based on the frequency error estimate.

These various features are described in detail below.

The digital clock has spurs that can degrade performance if used for sampling by $\Delta\Sigma$ ADCs 124. These spurs are generated by dividing an oscillator signal by a non-integer divider ratio that can vary over temperature due to frequency drift in crystal oscillator 130. This potential degradation is avoided by using a sampling clock having good phase noise characteristics for $\Delta\Sigma$ ADCs 124. This sampling clock is generated by dividing the Rx_LO signal by a fixed integer divider ratio that does not change regardless of (1) the CDMA channel being received and (2) the frequency drift in crystal oscillator 130. This results in the sampling clock not being synchronized with the digital clock. Re-clocking circuit 154 performs re-clocking of the samples so that (1) ADCs 124 and digital filter 152 can operate based on the sampling clock and (2) digital rotator 156, post processor 158, rake receiver 160 and subsequent processing units can operate based on the digital clock.

Figure 2:
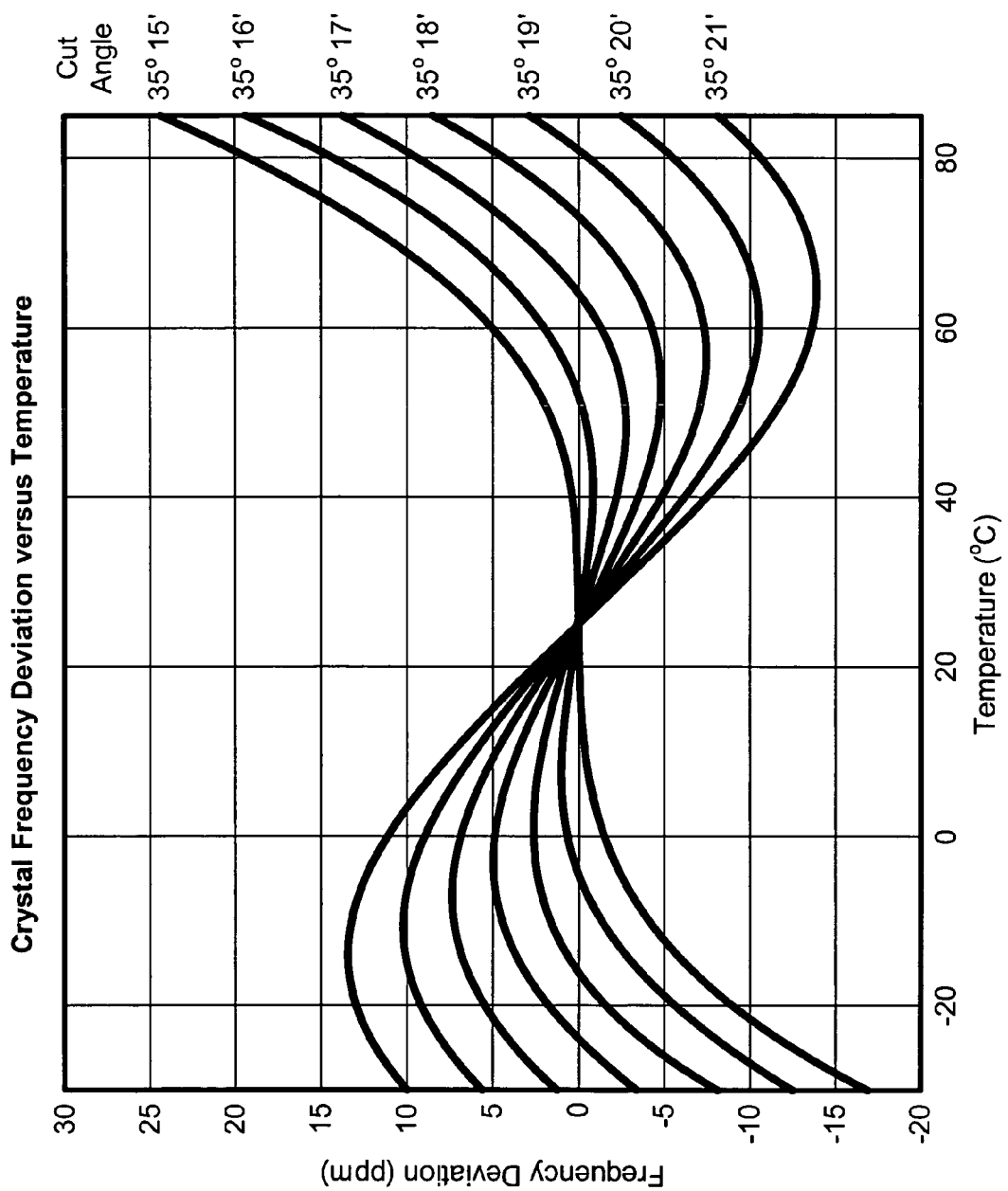
FIG. 2 shows frequency deviation versus temperature for an AT-cut crystal.

FIG. 2 shows plots of frequency deviation versus temperature for an exemplary AT-cut crystal. Different types of crystal cuts are available, and a popular cut for good frequency stability is the AT-cut. A crystal is typically cut such that it resonates at a desired nominal frequency (e.g., 19.2 MHz) at room temperature (e.g., 23° Celsius). The resonant frequency of the crystal varies across temperature based on a curve that is dependent on the angle of the crystal cut. FIG. 2 shows the curves for seven different cut angles for an AT-cut crystal. Each curve shows the deviation from the nominal frequency, in parts per million (ppm), across temperature for a specific cut angle.

Crystal oscillator 130 may be designed such that its oscillation frequency falls within a specified range. This covers the initial frequency error for the crystal and frequency drift over temperature. For example, the specified range may be ±20 ppm to cover a crystal frequency error of ±10 ppm and a temperature drift of ±10 ppm. In this case, the reference signal from crystal oscillator 130 may be off by as much as ±20 ppm from the nominal frequency.

For the embodiment shown in FIG. 1, the reference signal from crystal oscillator 130 is used to generate (1) the Rx_LO signal used for frequency downconversion, (2) the Tx_LO signal used for frequency upconversion, and (3) the oscillator signal used to generate the digital clock. The frequencies of the Rx_LO, Tx_LO, and oscillator signals are related to the reference frequency by some fixed ratios. Hence, an error of X ppm in the reference frequency results in an error of X ppm in the Rx_LO, Tx_LO, and oscillator frequencies. The frequency errors in the Rx_LO, Tx_LO, and oscillator signals may be handled as described below.

Figure 3:
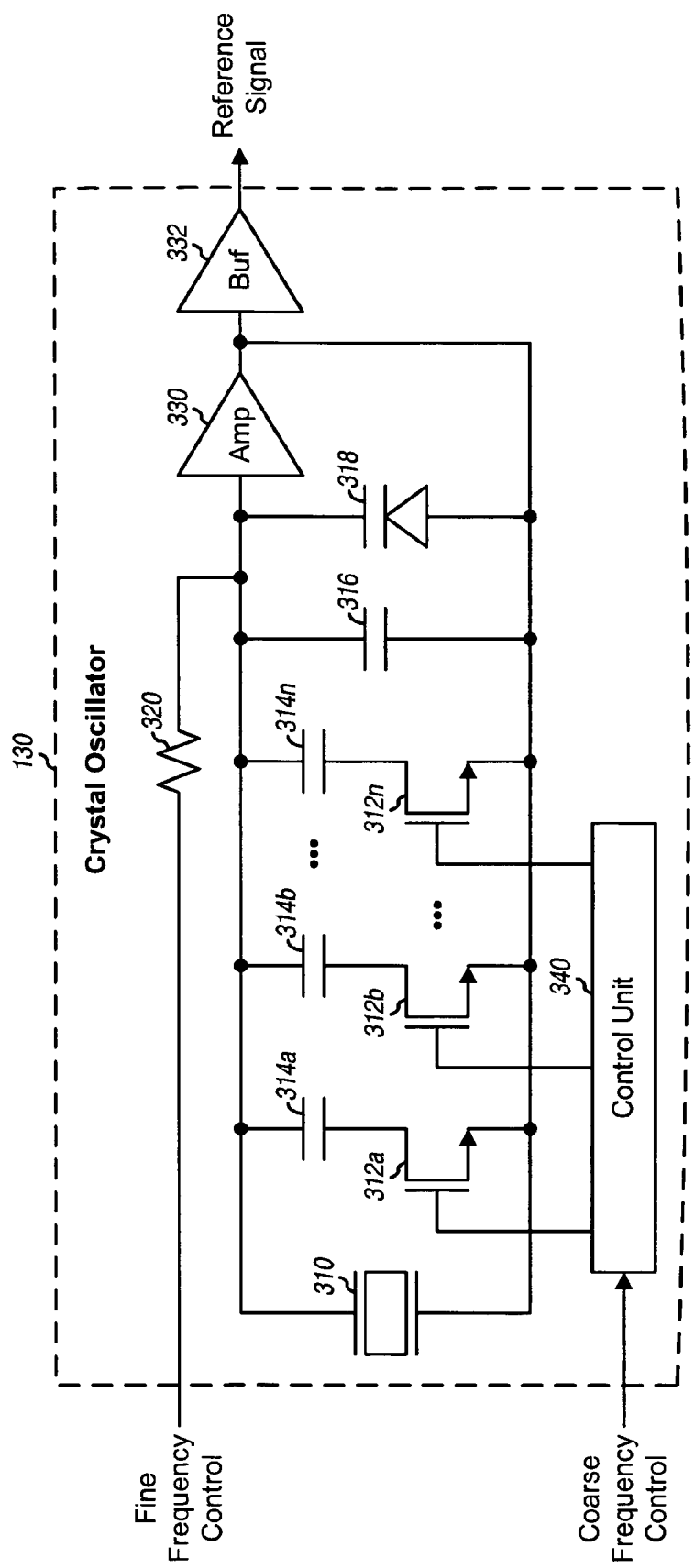
FIG. 3 shows a schematic diagram of a crystal oscillator.

FIG. 3 shows a schematic diagram of an embodiment of crystal oscillator 130. For this embodiment, crystal oscillator 130 includes (1) a coarse tune control circuit that may be used for coarse frequency adjustment and (2) a fine tune control circuit that may be used for fine frequency adjustment.

Within crystal oscillator 130, a crystal 310, a capacitor 316, and a variable capacitor (varactor) 318 couple in parallel and between the input and output of an amplifier (Amp) 330. N-channel field effect transistors (N-FETs) 312a through 312n have their sources coupled to the output of amplifier 330, their gates coupled to a control unit 340, and their drains coupled to one end of each of capacitors 314a through 314n, respectively. The other end of each of capacitors 314a through 314n couple to the input of amplifier 330. Control unit 340 receives a coarse frequency control signal and generates the control signals for N-FETs 312a through 312n. A resistor 320 has one end coupled to the input of amplifier 330 and the other end receiving a fine frequency control signal. A buffer (Buf) 332 has its input coupled to the output of amplifier 330 and its output providing the reference signal.

Amplifier 330 provides the signal amplification required for oscillation. Crystal 310, capacitors 314a through 314n and 316, and varactor 318 form a resonant circuit that determines the frequency of oscillation. N-FETs 312a through 312n act as switches that connect or disconnect the corresponding capacitors 314a through 314n from the resonant circuit. Buffer 332 provides buffering and signal drive for the reference signal.

The coarse tune control circuit includes N-FETs 312a through 312n, capacitors 314a through 314n, and control unit 340. Capacitors 314a through 314n may have different capacitances that can vary the oscillation frequency by different amounts when connected. Capacitors 314a through 314n may be selectively connected or disconnected based on the coarse frequency control signal. For example, a 3-bit coarse tune control circuit may be used to adjust the oscillation frequency by approximately 5 ppm for each least significant bit (LSB) of control. The fine tune control circuit includes varactor 318 and resistor 320. Varactor 318 has a capacitance that can be adjusted based on the voltage of the fine frequency control signal. For example, the fine tune control circuit may provide a tuning range of ±10 ppm. The coarse and/or tune control circuits may be used to adjust the oscillation frequency to account for known variations and/or for other purposes. The coarse and/or tune control circuits may also be omitted from crystal oscillator 130.

Figure 4:
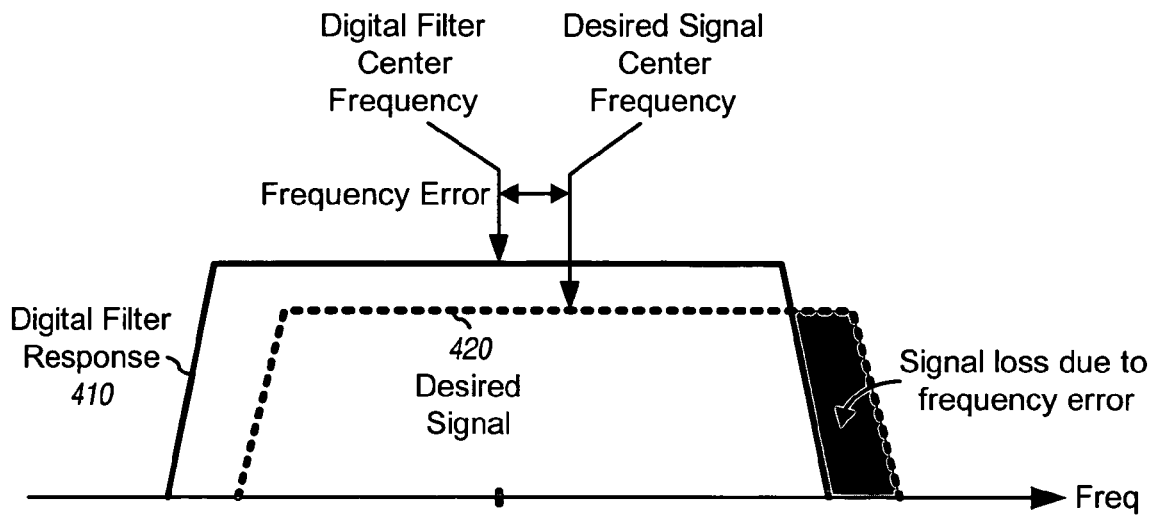
FIG. 4 shows a frequency response for a digital filter and a spectral plot of a desired signal.

FIG. 4 shows a frequency response 410 for digital filter 152 in FIG. 1 and a spectral plot 420 of a desired signal. As noted above, frequency error in crystal oscillator 130 causes frequency error in the Rx_LO signal, which results in the desired signal being downconverted near DC instead of at DC. For example, a frequency error of 20 ppm for the reference signal results in the Rx_LO signal being off in frequency by approximately 18 KHz for the cellular band and approximately 39 KHz for the PCS band. After frequency downconversion, the desired signal is centered at approximately 18 KHz for the cellular band and at 39 KHz for the PCS band, instead of at DC. If the bandwidth of digital filter 152 is matched to the bandwidth of the desired signal and is fixed, then a portion of the desired signal is filtered out by the digital filter if there is frequency error, as illustrated in FIG. 4. The signal portion that is filtered out by digital filter 152 causes signal loss and inter-chip interference, both of which degrade the signal-to-noise-and-interference ratio (SNR) of the filtered signal.

Figure 5:
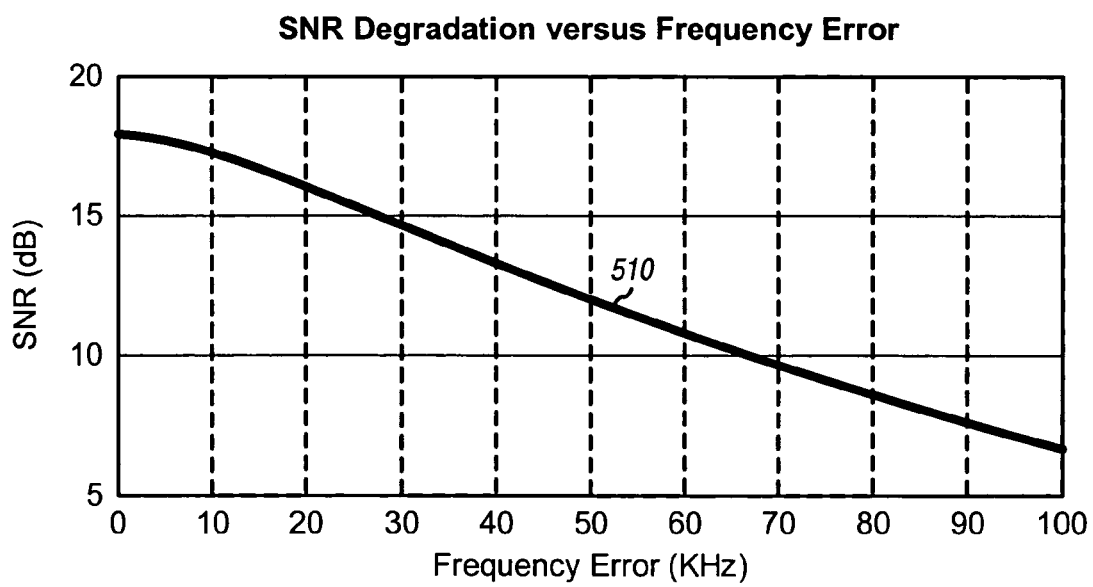
FIG. 5 shows a plot of degradation in SNR versus frequency error.

FIG. 5 shows a plot 510 of degradation in SNR versus frequency error for a fixed digital filter 152 with a one-sided bandwidth of 614 KHz, which is matched to the desired signal bandwidth. Plot 510 assumes that the ADC samples have four bits of resolution. FIG. 5 indicates that SNR degrades with larger frequency error. For a frequency error of 20 ppm, a SNR of greater than 18 dB may be achieved for the cellular band (18 KHz error), and an SNR of greater than 13 dB may be achieved for the PCS band (39 KHz error). SNR of 13 dB or greater is typically acceptable for CDMA.

In an embodiment, digital filter 152 has a fixed bandwidth, which can simplify the design of the digital filter. In another embodiment, digital filter 152 has a variable bandwidth that is adjustable based on the frequency error. A wider bandwidth may be used for a larger frequency error, and a smaller bandwidth may be used for a smaller frequency error estimate. In yet another embodiment, digital filter 152 has an adjustable center frequency that tracks the frequency error.

Figure 6:
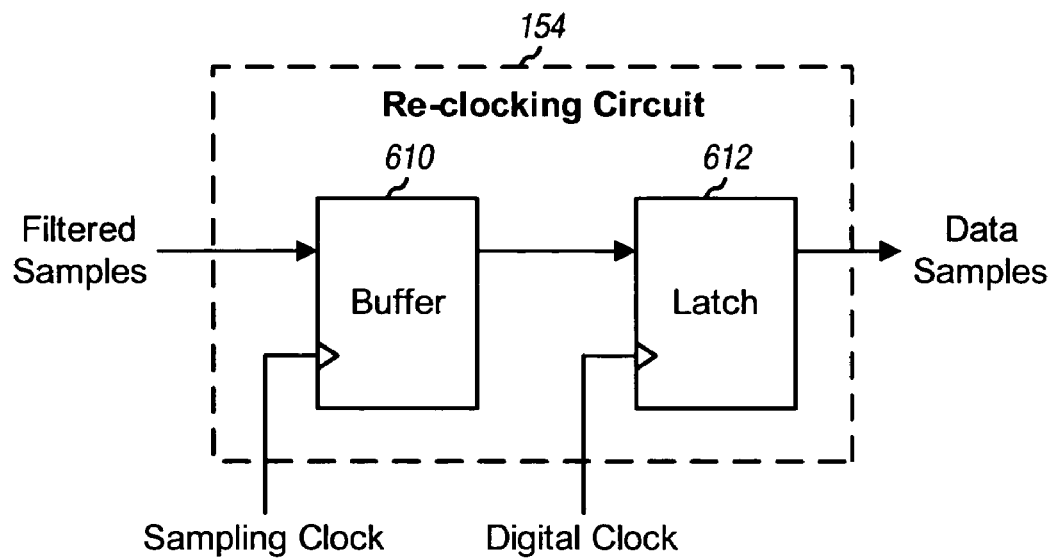
FIG. 6 shows a block diagram of an embodiment of a re-clocking circuit.

FIG. 6 shows a block diagram of an embodiment of re-clocking circuit 154 in FIG. 1. For this embodiment, the filtered samples from digital filter 152 are stored in a buffer 610 that is clocked by the sampling clock. A latch 612 receives and latches the output of buffer 610 based on the digital clock and provides data samples to digital rotator 156.

Latch 612 may be designed using techniques known in the art to address meta-stability issues arising from latching asynchronous data.

Figure 7:
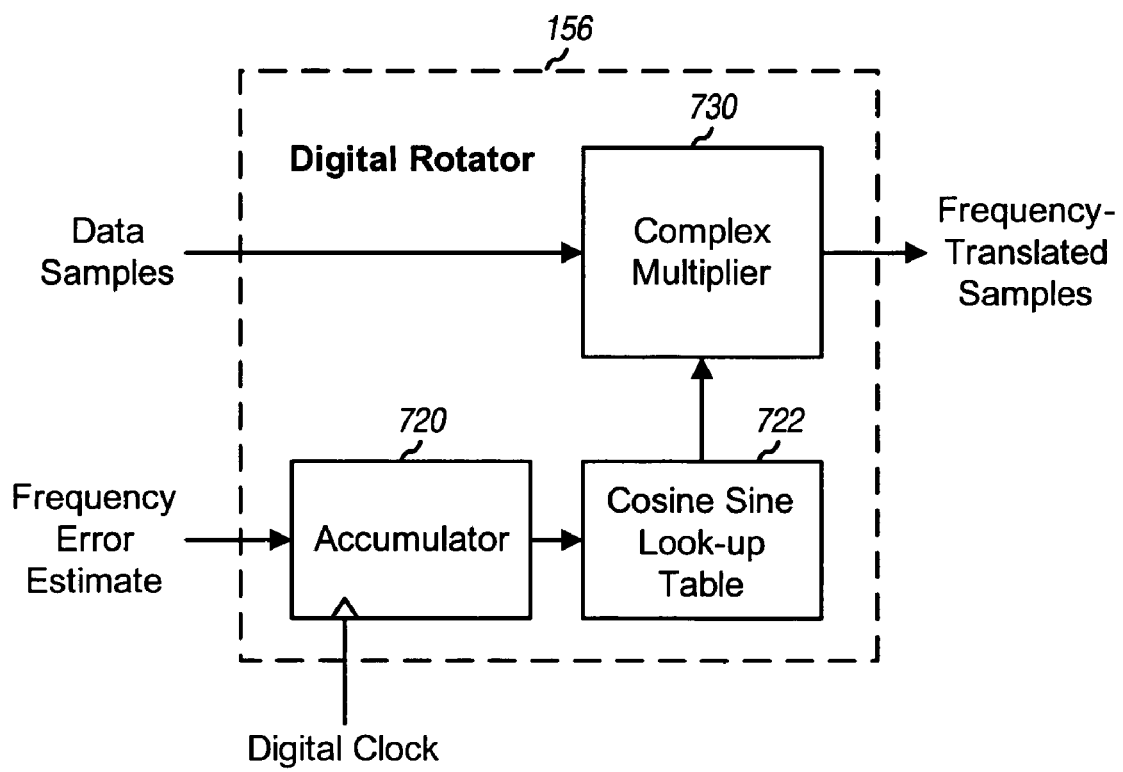
FIG. 7 shows a block diagram of an embodiment of a digital rotator.

FIG. 7 shows a block diagram of an embodiment of RX digital rotator 156 for the receive path in FIG. 1. For this embodiment, an accumulator 720 receives and accumulates the frequency error estimate from AFC unit 172 and provides a phase output. A look-up table 722 provides the cosine and sine of the phase output from accumulator 720. For each clock period, a multiplier 730 performs a complex multiply of a data sample from re-clocking circuit 154 with the cosine and sine from look-up table 722 and provides a frequency-translated sample to post processor 158. The multiplication with the cosine and sine results in the frequency-translated samples from digital rotator 156 being centered near DC.

TX digital rotator 176 for the transmit path may be implemented similarly to RX digital rotator 156 for the receive path, except for two differences. First, the frequency error estimate is scaled by a scaling factor to account for the difference between the transmit and receive frequencies. The frequencies of the Rx_LO and Tx_LO signals are off by the same ppm error from crystal oscillator 130. The scaling factor is equal to the transmit frequency divided by the receive frequency. For example, if the frequency error estimate is 20 KHz, the receive frequency is 869 MHz, and the transmit frequency is 824 MHz, then the scaling factor is 0.947 and the scaled frequency error estimate is 18.94 KHz. Second, TX digital rotator 176 performs frequency translation in the opposite direction as RX digital rotator 156. Thus, if RX digital rotator 156 translates the data samples down in frequency, then TX digital rotator 176 translates the data chips up in frequency.

FIG. 7 shows an embodiment in which the frequency error estimate is available and used to frequency translate the data samples. This frequency error estimate may be derived based on a received pilot or some other known transmission.

Figure 8A:
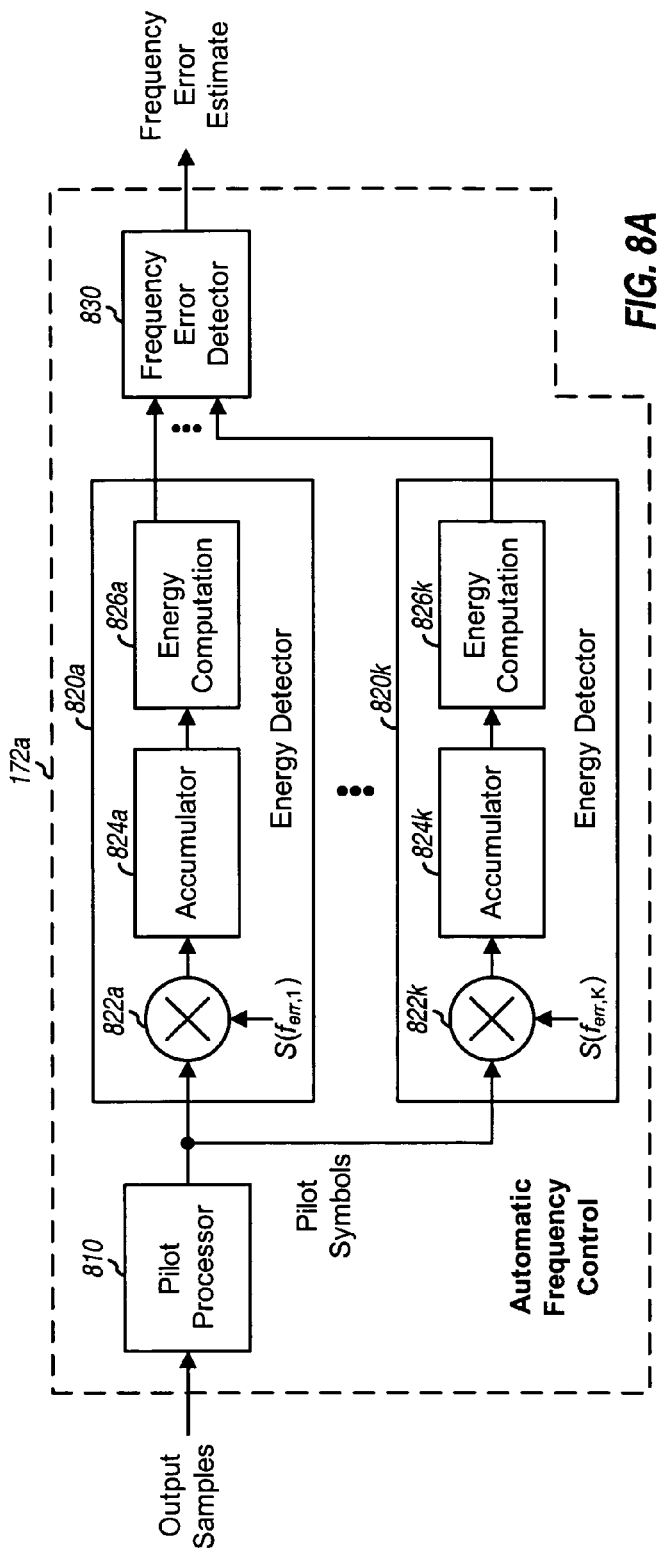
FIGS. 8A, 8B and 8C show block diagrams of three embodiments of an automatic frequency control (AFC) unit.

FIG. 8A shows a block diagram of an AFC unit 172a, which is an embodiment of AFC unit 172 in FIG. 1. For this embodiment, AFC unit 172a includes a pilot processor 810, multiple (K) energy detectors 820a through 820k, and a frequency error detector 830. Pilot processor 810 despreads the samples from post processor 158 or rake receiver 160 with a pseudo-random number (PN) sequence for a base station, decovers the despread samples with a pilot Walsh code, and provides pilot symbols to all K energy detectors 820a through 820k. Alternatively, pilot processor 810 may be part of rake receiver 160, which provides the pilot symbols.

Each energy detector 820 detects the energy of the pilot for a different hypothesized frequency error. Within each energy detector 820, a multiplier 822 multiplies each pilot symbol with a phasor $S(f_{err,k}) = \exp(-j2\pi \cdot f_{err,k} \cdot n \cdot T_p)$ and provides a rotated pilot symbol, where $f_{err,k}$ is the hypothesized frequency error for the energy detector, $T_p$ is one pilot symbol period, and n is a pilot symbol index. The rotation of the pilot symbols by the hypothesized frequency error $f_{err,k}$ results in the frequency error for the rotated pilot symbols becoming $f_{err} - f_{err,k}$, where $f_{err}$ is the actual frequency error. A coherent accumulator 824 accumulates M rotated pilot symbols, where M may be a fixed or configurable value. An energy computation unit 826 computes the pilot energy.

It can be shown that a function of pilot energy versus frequency error has a $\text{sinc}^2 ((f_{err} - f_{err,k}) \cdot N_{fc} \cdot T_p)$ term. The pilot energy is maximum when the hypothesized frequency error $f_{err,k}$ is equal to the actual frequency error $f_{err}$ and falls off by $\text{sinc}^2$ as $f_{err,k}$ departs from $f_{err}$. Frequency error detector 830 receives the pilot energies from all K energy detectors 820a through 820k and identifies the largest pilot energy.

Frequency error detector 830 then provides the hypothesized frequency error corresponding to the largest pilot energy as the frequency error estimate. Although not shown in FIG. 8A, the hypothesized frequency error corresponding to the largest pilot energy may also be filtered to obtain the frequency error estimate.

Figure 8B:
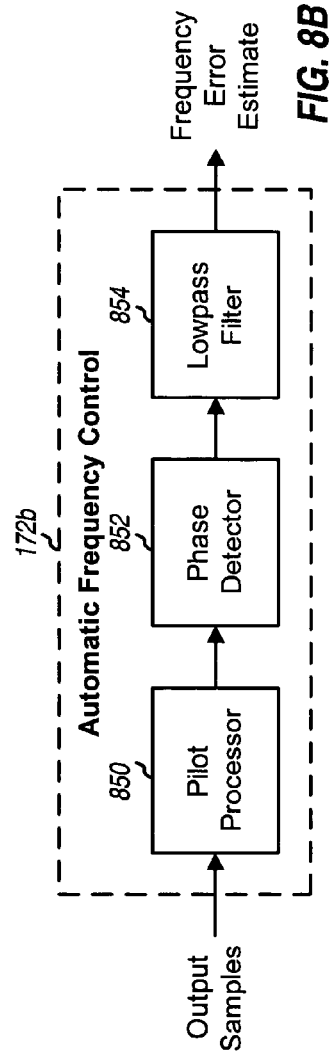

FIG. 8B shows a block diagram of an AFC unit 172b, which is another embodiment of AFC unit 172 in FIG. 1. Within AFC unit 172b, a pilot processor 850 despreads and decovers the samples and provides pilot symbols. A phase detector 852 receives the pilot symbols and determines the phase error between consecutive pilot symbols. For each pair of pilot symbols, $P_I(n)-jP_Q(n)$ and $P_I(n-1)-jP_Q(n-1)$, phase detector 852 may derive the phase error as $\Delta\theta(n) = P_I(n-1)\cdot P_Q(n) - P_I(n)\cdot P_Q((n-1)$. Other types of phase detector may also be used. The phase error is related to the frequency error as: $\Delta\theta = 2\pi \cdot f_{err} \cdot T_p$. Since $T_p$ is fixed, $\Delta\theta$ is proportional to the frequency error $f_{err}$. A lowpass filter 854 filters the phase error $\Delta\theta$, which is a noisy estimate of the actual phase error, and provides the frequency error estimate. Phase detector 852 and/or lowpass filter 854 may also perform scaling.

Figure 8C:
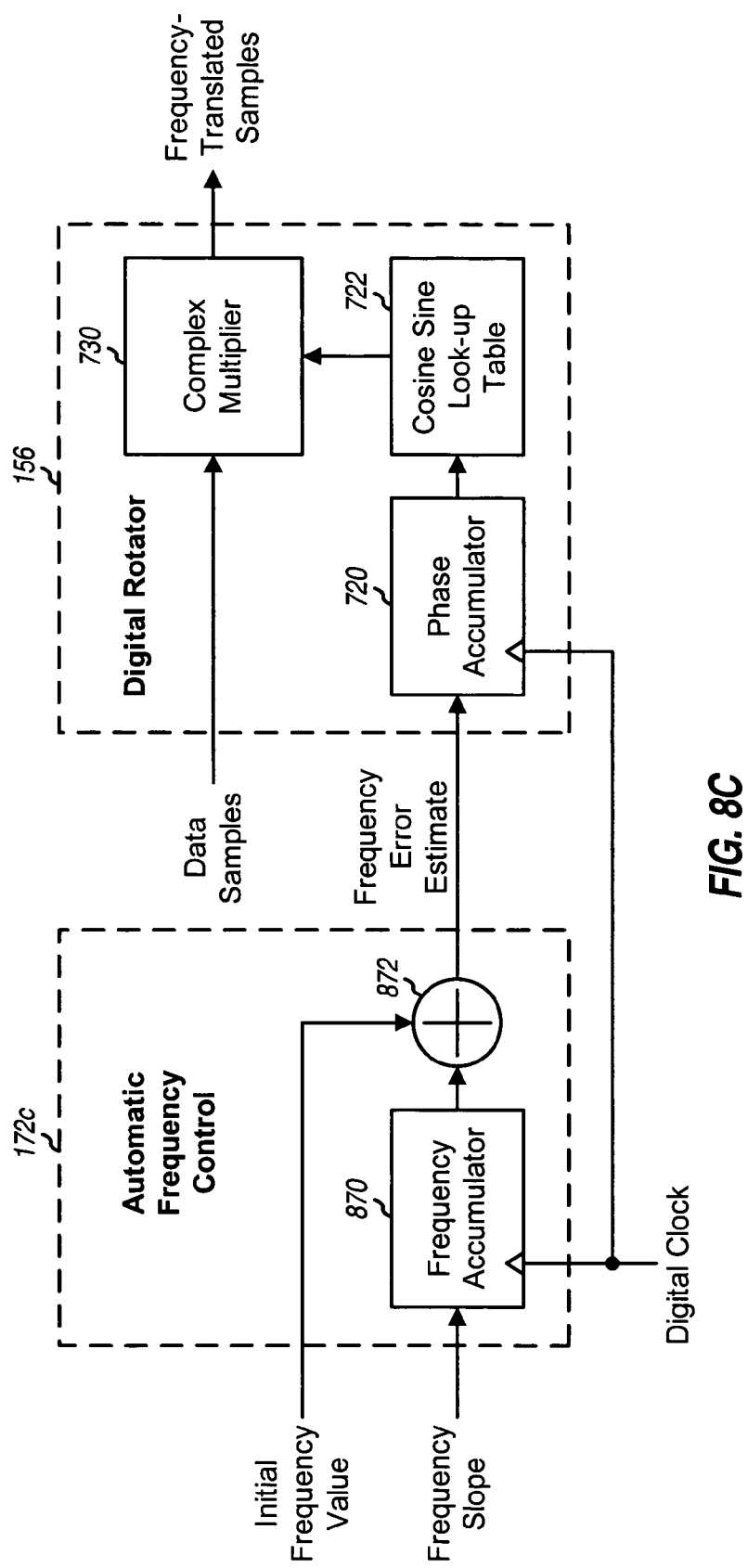

FIG. 8C shows a block diagram of an AFC unit 172c, which is another embodiment of AFC unit 172 in FIG. 1. Within AFC unit 172c, a frequency accumulator 870 receives and accumulates a frequency slope, which may be given in units of Hertz/second (Hz/sec), and provides a frequency delta. A summer 872 receives and sums the frequency delta with an initial frequency value and provides a frequency error estimate to RX digital rotator 156.

The initial frequency value may be provided by a look-up table, AFC unit 172a in FIG. 8A, AFC unit 172b in FIG. 8B, or some other unit. For example, a look-up table may store a set of initial frequency values for different temperature. The look-up table may receive the current temperature and may then provide the initial frequency value corresponding to this temperature to summer 872. The current temperature may be estimated using, e.g., a thermistor having a resistance or a voltage that varies with temperature.

The frequency slope may be derived from signal measurements, thermistor measurements, and so on. For example, measurements for multiple CDMA signals may be processed to isolate changes in frequency due to Doppler and temperature. Signals for two CDMA channels at two different center frequencies (or two frequency channels) may be measured and used to compute an overall frequency slope. A frequency slope due Doppler may be computed based on a known Doppler equation since different center frequencies exhibit different frequency slopes from the same base station. The frequency slope for the temperature portion may then be derived by subtracting out the Doppler portion from the overall frequency slope computed from the CDMA signals.

The thermistor may also be used to derive the frequency slope. An estimate of absolute temperature may be obtained from a single thermistor measurement. This absolute temperature estimate is typically not very accurate. A temperature difference may be accurately ascertained based on the difference between two thermistor measurements. The rate of change of frequency is proportional to the rate of change in temperature. Hence, an accurate frequency slope may be derived based on two thermistor measurements at known time instants. The frequency slope may be accumulated to obtain the frequency change for the current time instant.

AFC unit 172c may be advantageously used in instances where a pilot is not available (e.g., such as for a GPS signal) and in instances where it may not be possible or easy to estimate the frequency error based on the received signal. AFC unit 172c may also be used to accurately track changes in frequency due to temperature drift. AFC unit 172c may thus be used for temperature compensation.

Frequency error estimation may be performed using a combination of the schemes described above. For example, frequency error estimation for CDMA may be performed based on a combination of pilot monitoring in FIGS. 8A and/or 8B and temperature monitoring in FIG. 8C. Frequency error estimation may also be performed in other manners.

Figure 9:
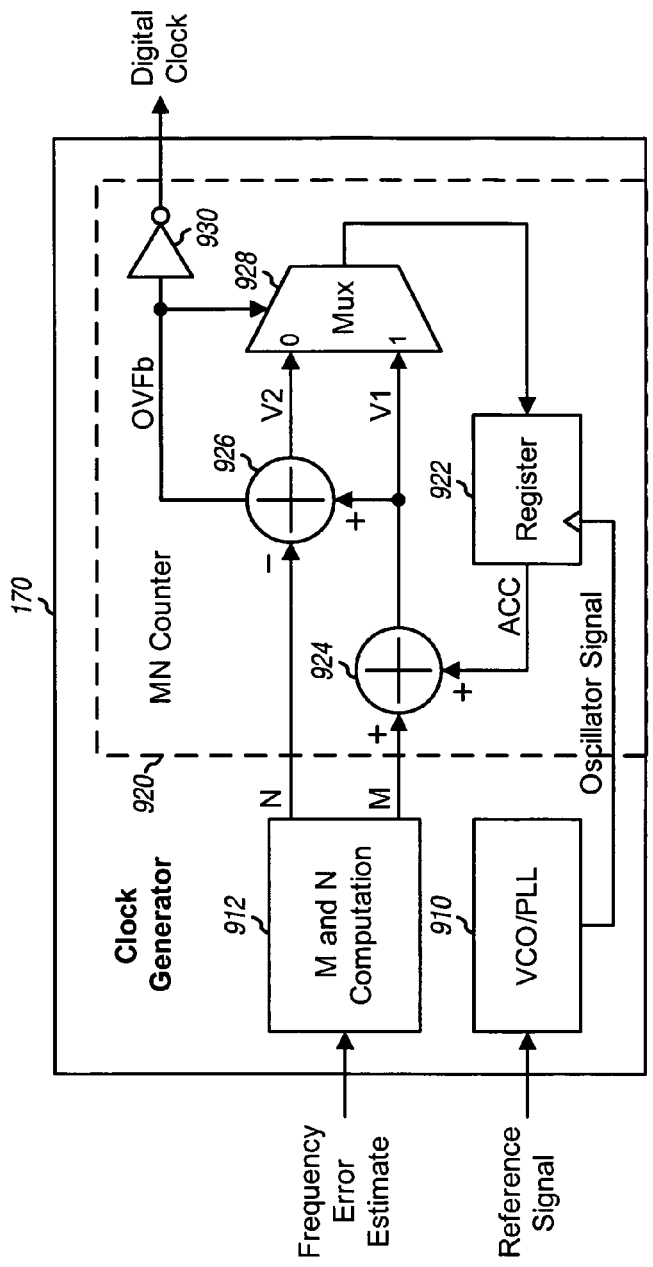
FIG. 9 shows a block diagram of an embodiment of a clock generator.

FIG. 9 shows a block diagram of an embodiment of clock generator 170 in FIG. 1. For this embodiment, clock generator 170 includes a VCO/PLL 910, a computation unit 912, and an MN counter 920. VCO/PLL 910 receives the reference signal and generates an oscillator signal that is multiple (e.g., 20) times higher in frequency than the reference signal. Computation unit 912 receives the frequency error estimate from AFC unit 172 and determines M and N values for MN counter 920. MN counter 920 divides the oscillator signal in frequency by a non-integer divider ratio of N/M and provides the digital clock having a frequency that is relatively accurate with respect to chip timing.

As a specific example, VCO/PLL 910 generates a 384 MHz oscillator signal, the chip×32 clock is 39.3216 MHz, and the nominal divider ratio is 9.765625 with no frequency error. M may be set equal to 1,024,000 and N may be set equal to $10 \times 10^6 \pm$[frequency error estimate (in ppm)×10]. The nominal divider ratio is obtained with a frequency error estimate of zero. A fast crystal oscillator 130 results in a high frequency error estimate, which results in a larger value for N, which results in a larger N/M divider ratio, which pushes the digital clock frequency lower to compensate for the fast crystal oscillator. The M and N values may be continually varied based on the frequency error estimate so that the digital clock frequency is close to chip timing. Other values may also be used for M and N.

MN counter 920 generates the digital clock having a frequency that is M/N times the frequency of the oscillator signal from VCO/PLL 910. Within MN counter 920, a summer 924 receives and adds M to an accumulator value (ACC) from a register 922 and provides a V1 value to a summer 926 and to a '1' input of a multiplexer (Mux) 928. Summer 926 receives and subtracts N from the V1 value and provides a V2 value to a '0' input of multiplexer 928. Summer 926 also provides a one-bit inverted overflow signal (OVFb) to an inverter 930 and to a select input of multiplexer 928. The OVFb signal is logic low if there is an overflow and logic high otherwise. Multiplexer 928 provides the V1 value if there is no overflow and the V2 value if there is an overflow. Register 922 receives and stores the value from multiplexer 928. Inverter 930 inverts the OVFb signal and provides the digital clock.

MN counter 920 operates as follows. Register 922, summers 924 and 926, and multiplexer 928 collectively implement a modulo-N accumulator that stores a value ranging from 0 to N−1. For each cycle of the oscillator signal, the accumulator accumulates M with the current accumulator value and provides the V1 value, which is stored back in register 922 if an overflow has not occurred. An overflow occurs whenever the V1 value exceeds N and is indicated by the OVFb signal being at logic low. When an overflow occurs, N is subtracted from the V1 value and the result is stored in register 922. A pulse is provided on the digital clock when an overflow occurs.

Rake receiver 160 typically includes multiple finger processors and one or more searchers. Each searcher processes the output samples from post processor 158 to search for strong signal instances, or multipaths, in the desired CDMA channel. Each finger processor may be assigned to process a particular multipath of interest, e.g., a multipath with sufficient received signal strength. Each assigned finger processor provides symbol estimates for its multipath. One or more finger processors may be assigned to process one or more multipaths, and the symbol estimates from all assigned finger processors may be combined to obtain an improved estimate of the transmitted symbols.

Each finger processor typically includes a frequency tracking loop (FTL) and a time tracking loop (TTL). The frequency tracking loop estimates and tracks small frequency error that may be caused by Doppler, residual frequency error in AFC unit 172, and so on. The time tracking loop estimates and tracks timing error that may be caused by error in the digital clock relative to chip timing. The frequency and time tracking are performed in order to keep the finger processor latched to the current channel conditions.

The frequency correction by digital rotators 156 and 176 and clock generator 170 may improve performance. A relatively large frequency error (e.g., 20 ppm) in crystal oscillator 130 results in the output samples having a large frequency error that may be beyond the tracking capability of the frequency tracking loop within each finger processor. By removing the large frequency error with digital rotator 156, the frequency tracking loop is able to track a smaller residual frequency error. The relatively large frequency error in crystal oscillator 130 also results in the digital clock potentially having a large timing error that may be beyond the tracking capability of the time tracking loop within each finger processor. By removing the large timing error with clock generator 170, the time tracking loop is able to track a smaller residual timing error.

Most of the description above assumes that the wireless device has already acquired a desired CDMA signal and is tracking the frequency error during normal operation. The wireless device may not be aware of any base stations (e.g., at power-up) and may perform a full search for pilots transmitted by nearby base stations. In one search scheme, the wireless device performs a search over an entire PN code space, identifies all peaks above a particular energy threshold, and then attempts acquisition on these identified peaks. In another search scheme, the wireless device sweeps the entire PN code space, identifies and re-evaluates a set of peaks found during the initial sweep to find candidate peaks, and then attempts acquisition on these candidate peaks.

The probability of acquiring a pilot in the presence of noise is dependent on frequency error as well as other factors. The searcher can reliably acquire a pilot if the frequency error is within a design range (e.g., ±2.5 ppm). To improve pilot acquisition performance, the total range of frequency errors due to crystal oscillator 130 may be partitioned into multiple bins, with each bin being smaller than the design range for the searcher. Pilot acquisition may then be performed for one bin at a time. For each bin, the frequency error corresponding to the center of that bin is provided to digital rotator 156, which frequency translates the data samples by this frequency error.

Figure 10:
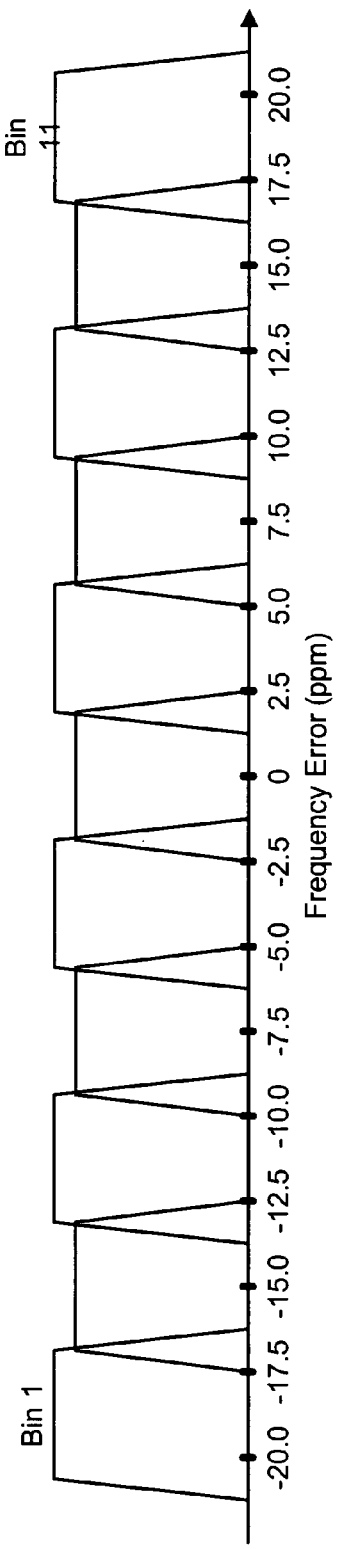
FIG. 10 shows partitioning of the total frequency error range into multiple bins for acquisition.

FIG. 10 shows an exemplary partitioning of the total frequency error range of ±20 ppm into 11 overlapping bins. The middle bin may be centered at DC (as shown in FIG. 10) or may be centered at an expected frequency error for crystal oscillator 130.

Partitioning the total frequency error range into multiple bins and performing pilot acquisition for each bin can shorten acquisition time. The time required for the frequency control loop to pull-in a particular frequency error is typically more than a linear function of frequency error, e.g., the time required to pull-in a frequency error of 2.5 ppm may be less than half of the time required to pull-in a frequency error of 5 ppm. Binning can improve acquisition performance since (1) the searcher has reduced visibility with increasing frequency error and (2) the frequency control loop is typically unable to acquire a frequency error beyond its pull-in range.

A look-up table of frequency error versus temperature may be ascertained, e.g., during normal operation, and may thereafter be used for acquisition. The wireless device may have a temperature sensing thermistor. During normal operation, the wireless device can ascertain temperature based on the thermistor, obtain the corresponding frequency error estimate from AFC unit 172, and store the frequency error estimate along with the temperature in the look-up table. Thereafter, at the start of acquisition, the wireless device may determine the temperature at that time instant and may start a search in the bin that covers the frequency error associated with this temperature.

If crystal oscillator 130 has coarse and/or fine frequency control, e.g., as shown in FIG. 3, then the crystal oscillator may be adjusted based on the frequency error estimate such that the reference signal is closer to the nominal frequency. Reducing the frequency error may result in less signal loss through digital filter 152, which may improve performance for both normal operation and initial acquisition.

The wireless device described herein may be able to receive various types of signals such as, e.g., CDMA signals, GPS signals, and so on. The frequency error estimation may be performed based on a received signal (e.g., a received pilot), based on temperature measurements, and so on. The frequency error estimation and correction may be performed continuously during the time that the received signal is being processed, during the time that a pilot is available, during the time that data is being received, and so on. In general, the frequency error estimation and correction may be performed based on the characteristics of the received signal.

The wireless device described herein may be implemented by various means, e.g., with hardware, firmware, software, or a combination thereof. For a hardware implementation, the processing units within the wireless device may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof. For example, transceiver 120 may be implemented within an RF integrated circuit (RFIC) and digital section 150 may be implemented within an ASIC.

Certain aspects of the wireless device may be implemented with software (e.g., modules such as procedures, functions, and so on) that performs the functions described herein. The software codes may be stored in a memory (e.g., memory 182 in FIG. 1) and executed by a processor (e.g., controller 180). The memory may be implemented within the processor or external to the processor.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus comprising:
a control unit operative to estimate a frequency error of a crystal oscillator and to provide a frequency error estimate, wherein the crystal oscillator is not compensated for temperature and the frequency error is temperature dependent;
a rotator operative to receive data samples having the frequency error, to frequency translate the data samples based on the frequency error estimate, and to provide frequency-translated samples; and
at least one analog-to-digital converter (ADC) operative to digitize an analog signal based on a sampling clock and provide ADC samples, wherein the sampling clock has the frequency error.

2. An apparatus comprising:
a control unit operative to estimate a frequency error of a crystal oscillator and to provide a frequency error estimate, wherein the crystal oscillator is not compensated for temperature and the frequency error is temperature dependent; and
a rotator operative to receive data samples having the frequency error, to frequency translate the data samples based on the frequency error estimate, and to provide frequency-translated samples, wherein the rotator comprises:
an accumulator operative to accumulate the frequency error estimate and provide a phase output,
a look-up table operative to receive the phase output and provide sine and cosine of the phase output, and
a multiplier operative to multiply the data samples with the sine and cosine to generate the frequency-translated samples.

3. The apparatus of claim 1, comprising:
a clock generator operative to generate a digital clock based on a reference signal from the crystal oscillator and the frequency error estimate, wherein the digital clock has at least a portion of the frequency error removed.

4. The apparatus of claim 3, wherein the clock generator is operative to determine M and N integer values based on the frequency error estimate and to generate the digital clock based on the M and N integer values.

5. An apparatus comprising:
a control unit operative to estimate a frequency error of a crystal oscillator and to provide a frequency error estimate, wherein the crystal oscillator is not compensated for temperature and the frequency error is temperature dependent;
a rotator operative to receive data samples having the frequency error, to frequency translate the data samples based on the frequency error estimate, and to provide frequency-translated samples; and
at least one delta-sigma analog-to-digital converter (ΔΣ ADC) operative to digitize an analog signal based on a sampling clock and provide ADC samples, wherein the sampling clock is multiple times higher than chip rate and has the frequency error.

6. The apparatus of claim 1, further comprising:
a divider operative to receive a local oscillator (LO) signal having the frequency error and to generate the sampling clock based on the LO signal and a fixed integer divider ratio.

7. The apparatus of claim 1, further comprising:
a digital filter operative to receive input samples having the frequency error, to filter the input samples based on a fixed frequency response, and to provide filtered samples.

8. An apparatus comprising:
a control unit operative to estimate a frequency error of a crystal oscillator and to provide a frequency error estimate, wherein the crystal oscillator is not compensated for temperature and the frequency error is temperature dependent;
a rotator operative to receive data samples having the frequency error, to frequency translate the data samples based on the frequency error estimate, and to provide frequency-translated samples; and
a re-clocking circuit operative to receive input samples generated based on a sampling clock having the frequency error, to re-clock the input samples based on a digital clock having at least a portion of the frequency error removed, and to provide the data samples.

9. An apparatus comprising:
a control unit operative to estimate a frequency error of a crystal oscillator and to provide a frequency error estimate, wherein the crystal oscillator is not compensated for temperature and the frequency error is temperature dependent, and wherein the control unit is operative to detect energies for a plurality of hypothesized frequency errors and to provide a hypothesized frequency error with largest energy as the frequency error estimate; and
a rotator operative to receive data samples having the frequency error, to frequency translate the data samples based on the frequency error estimate, and to provide frequency-translated samples.

10. An apparatus comprising:
a control unit operative to estimate a frequency error of a crystal oscillator and to provide a frequency error estimate, wherein the crystal oscillator is not compensated for temperature and the frequency error is temperature dependent, and wherein the control unit is operative to detect phase error based on a received pilot and to derive the frequency error estimate based on the detected phase error; and
a rotator operative to receive data samples having the frequency error, to frequency translate the data samples based on the frequency error estimate, and to provide frequency-translated samples.

11. An apparatus comprising:
a control unit operative to estimate a frequency error of a crystal oscillator and to provide a frequency error estimate, wherein the crystal oscillator is not compensated for temperature and the frequency error is temperature dependent, and wherein the control unit is operative to determine a temperature difference, to ascertain a frequency error difference based on the temperature difference, and to determine the frequency error estimate based on the frequency error difference; and
a rotator operative to receive data samples having the frequency error, to frequency translate the data samples based on the frequency error estimate, and to provide frequency-translated samples.

12. An apparatus comprising:
a control unit operative to estimate a frequency error of a crystal oscillator and to provide a frequency error estimate, wherein the crystal oscillator is not compensated for temperature and the frequency error is temperature dependent, and wherein the control unit is operative to accumulate a frequency slope and to derive the frequency error estimate based on the accumulated frequency slope; and a rotator operative to receive data samples having the frequency error, to frequency translate the data samples based on the frequency error estimate, and to provide frequency-translated samples.

13. The apparatus of claim 12, wherein the control unit is operative to derive the frequency slope based on multiple temperature measurements.

14. The apparatus of claim 12, wherein the control unit is operative to derive the frequency slope based on multiple signal measurements for multiple frequency channels.

15. An apparatus comprising:
a control unit operative to estimate a frequency error of a crystal oscillator and to provide a frequency error estimate, wherein the crystal oscillator is not compensated for temperature and the frequency error is temperature dependent, and wherein the control unit is operative to accumulate a frequency slope to obtain a frequency change and to sum the frequency change with an initial frequency value to obtain the frequency error estimate; and a rotator operative to receive data samples having the frequency error, to frequency translate the data samples based on the frequency error estimate, and to provide frequency-translated samples.

16. The apparatus of claim 1, further comprising:
a receiver operative to receive an input radio frequency (RF) signal and a local oscillator (LO) signal having the frequency error, to frequency downconvert the input RF signal with the LO signal, and to provide a baseband signal.

17. The apparatus of claim 1, further comprising:
a local oscillator (LO) generator operative to receive a reference signal from the crystal oscillator and to generate a transmit LO signal and a receive LO signal based on the reference signal, wherein the transmit and receive LO signals have the frequency error and are used for frequency upconversion and downconversion, respectively.

18. An apparatus comprising:
a control unit operative to estimate a frequency error of a crystal oscillator and to provide a frequency error estimate, wherein the crystal oscillator is not compensated for temperature and the frequency error is temperature dependent;

a rotator operative to receive data samples having the frequency error, to frequency translate the data samples based on the frequency error estimate, and to provide frequency-translated samples; and a second rotator operative to receive data chips to be transmitted, to frequency translate the data chips based on the frequency error estimate, and to provide frequency-translated chips.

19. An apparatus comprising:
a control unit operative to estimate a frequency error of a crystal oscillator and to provide a frequency error estimate, wherein the crystal oscillator is not compensated for temperature and the frequency error is temperature dependent;

a rotator operative to receive data samples having the frequency error, to frequency translate the data samples based on the frequency error estimate, and to provide frequency-translated samples; and a searcher operative to search for pilots in each of a plurality of bins, each bin corresponding to a different range of possible frequency errors for the crystal oscillator.

20. The apparatus of claim 19, further comprising:
a memory operative to store a table of frequency error versus temperature, and
wherein the searcher is operative to search for the pilots based on the table.

21. The apparatus of claim 1, wherein the data samples are for a CDMA signal.

22. The apparatus of claim 1, wherein the data samples are for a GPS signal.

23. An apparatus comprising:
a control unit operative to estimate a frequency error of a crystal oscillator and to provide a frequency error estimate, wherein the crystal oscillator is not compensated for temperature and the frequency error is temperature dependent, and wherein the control unit is operative to estimate the frequency error of the crystal oscillator based on a continuously transmitted pilot; and a rotator operative to receive data samples having the frequency error, to frequency translate the data samples based on the frequency error estimate, and to provide frequency-translated samples.

24. An integrated circuit comprising:
a control unit operative to estimate a frequency error of a crystal oscillator and to provide a frequency error estimate, wherein the crystal oscillator is not compensated for temperature and the frequency error is temperature dependent;

a rotator operative to receive data samples having the frequency error, to frequency translate the data samples based on the frequency error estimate, and to provide frequency-translated samples; and a re-clocking circuit operative to receive input samples generated based on a sampling clock having the frequency error, to re-clock the input samples based on a digital clock having at least a portion of the frequency error removed, and to provide the data samples.

25. An apparatus comprising:
means for estimating a frequency error of a crystal oscillator to obtain a frequency error estimate, wherein the crystal oscillator is not compensated for temperature and the frequency error is temperature dependent;

means for frequency translating data samples based on the frequency error estimate to obtain frequency-translated samples, wherein the data samples have the frequency error; and means for re-clocking input samples based on a digital clock to obtain the data samples, wherein the input samples are generated based on a sampling clock having the frequency error, and wherein the digital clock has at least a portion of the frequency error removed.

26. An apparatus comprising:
means for estimating a frequency error of a crystal oscillator to obtain a frequency error estimate, wherein the crystal oscillator is not compensated for temperature and the frequency error is temperature dependent;

means for frequency translating data samples based on the frequency error estimate to obtain frequency-translated samples, wherein the data samples have the frequency error; and means for frequency translating data chips based on the frequency error estimate to obtain frequency-translated chips, wherein the frequency-translated chips are upconverted based on a transmit local oscillator (LO) signal having the frequency error.

27. A method comprising:
estimating a frequency error of a crystal oscillator to obtain a frequency error estimate, wherein the crystal oscillator is not compensated for temperature and the frequency error is temperature dependent;
frequency translating data samples based on the frequency error estimate to obtain frequency-translated samples, wherein the data samples have the frequency error; and
re-clocking input samples based on a digital clock to obtain the data samples, wherein the input samples are generated based on a sampling clock having the frequency error, and wherein the digital clock has at least a portion of the frequency error removed.

28. A method comprising:
estimating a frequency error of a crystal oscillator to obtain a frequency error estimate, wherein the crystal oscillator is not compensated for temperature and the frequency error is temperature dependent;
frequency translating data samples based on the frequency error estimate to obtain frequency-translated samples, wherein the data samples have the frequency error; and
frequency translating data chips based on the frequency error estimate to obtain frequency-translated chips, wherein the frequency-translated chips are upconverted based on a transmit local oscillator (LO) signal having the frequency error.

29. A wireless device comprising:
an oscillator operative to provide a reference signal having a frequency error that is temperature dependent;
a control unit operative to estimate the frequency error of the reference signal and provide a frequency error estimate;
at least one delta-sigma analog-to-digital converter (ΔΣ ADC) operative to digitize an analog signal based on a sampling clock and provide ADC samples, wherein the sampling clock has the frequency error; and
a rotator operative to frequency translate data samples based on the frequency error estimate and provide frequency-translated samples, wherein the data samples are the ADC samples or are generated based on the ADC samples.

30. The wireless device of claim 29, further comprising:
a digital filter operative to filter the ADC samples based on a fixed frequency response and provide filtered samples.

31. A wireless device comprising:
an oscillator operative to provide a reference signal having a frequency error that is temperature dependent;
a control unit operative to estimate the frequency error of the reference signal and provide a frequency error estimate;
at least one delta-sigma analog-to-digital converter (ΔΣ ADC) operative to digitize an analog signal based on a sampling clock and provide ADC samples, wherein the sampling clock has the frequency error;
a rotator operative to frequency translate data samples based on the frequency error estimate and provide frequency-translated samples, wherein the data samples are the ADC samples or are generated based on the ADC samples; and
a re-clocking circuit operative to re-clock input samples based on a digital clock and provide the data samples, wherein the input samples are generated based on a sampling clock having the frequency error, wherein the digital clock has at least a portion of the frequency error removed.

32. A controller-readable memory having instructions thereon, the instructions comprising:
code for estimating a frequency error of a crystal oscillator to obtain a frequency error estimate, wherein the crystal oscillator is not compensated for temperature and the frequency error is temperature dependent;
code for frequency translating data samples based on the frequency error estimate to obtain frequency-translated samples, wherein the data samples have the frequency error; and
code for re-clocking input samples based on a digital clock to obtain the data samples, wherein the input samples are generated based on a sampling clock having the frequency error, and wherein the digital clock has at least a portion of the frequency error removed.

33. The wireless device of claim 31, further comprising:
a digital filter operative to filter the ADC samples based on a fixed frequency response and provide filtered samples.

34. The wireless device of claim 31, further comprising:
a clock generator operative to generate the digital clock based on the reference signal from the oscillator and the frequency error estimate, wherein the digital clock has at least a portion of the frequency error removed.

35. The wireless device of claim 31, wherein the rotator comprises:
an accumulator operative to accumulate the frequency error estimate and provide a phase output,
a look-up table operative to receive the phase output and provide sine and cosine of the phase output, and
a multiplier operative to multiply the data samples with the sine and cosine to generate the frequency-translated samples.

36. An apparatus comprising:
a control unit operative to estimate a frequency error of a crystal oscillator and to provide a frequency error estimate, wherein the crystal oscillator is not compensated for temperature and the frequency error is temperature dependent; and
a rotator operative to receive data samples having the frequency error, to frequency translate the data samples based on the frequency error estimate, and to provide frequency-translated samples, wherein the rotator comprises an accumulator operative to accumulate the frequency error estimate and provide a phase output.

37. The apparatus of claim 36, further comprising:
a clock generator operative to generate a digital clock based on a reference signal from the crystal oscillator and the frequency error estimate, wherein the digital clock has at least a portion of the frequency error removed.

38. The apparatus of claim 36, further comprising:
at least one analog-to-digital converter (ADC) operative to digitize an analog signal based on a sampling clock and provide ADC samples, wherein the sampling clock has the frequency error.

* * * * *